(12) United States Patent
Sakazaki et al.

(10) Patent No.: US 6,400,017 B2
(45) Date of Patent: Jun. 4, 2002

(54) SEMICONDUCTOR DEVICE AND METHOD FOR MANUFACTURING SAME

(75) Inventors: Atsushi Sakazaki; Tomonobu Yoshitake, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/961,317

(22) Filed: Sep. 25, 2001

Related U.S. Application Data

(62) Division of application No. 09/506,005, filed on Feb. 17, 2000, now Pat. No. 6,323,061.

(30) Foreign Application Priority Data

Feb. 18, 1999 (JP) .............................................. 11-39986

(51) Int. Cl.[7] .............................................. H01L 27/10
(52) U.S. Cl. ........................ 257/735; 257/736; 438/113
(58) Field of Search .................................. 257/735, 736, 257/734; 438/113

(56) References Cited

U.S. PATENT DOCUMENTS

| 6,019,523 A | 1/2000 | Honmou |
| 6,049,121 A | 4/2000 | Toyosawa et al. |
| 6,184,109 B1 | 2/2001 | Sasaki et al. |

*Primary Examiner*—Michael J. Sherry
*Assistant Examiner*—Vinny Bhagawan
(74) *Attorney, Agent, or Firm*—Young & Thompson

(57) ABSTRACT

A method of making a semiconductor chip 1 having a first electrodes 11, 12 on main surface 1a thereof, a second electrode 13 made of a conductive resin electrode having a base portion 131 in contact with a surface 1b opposite to the main surface 1a of the semiconductor chip 1, and a side portion 132 extended from one end portion of the base portion 131 in the direction toward the main surface 1a of the semiconductor chip 1, wherein an end part of the side portion 132 of the second electrode 13 is exposed on the same side as the first electrodes 11, 12.

4 Claims, 5 Drawing Sheets

Fig. 1
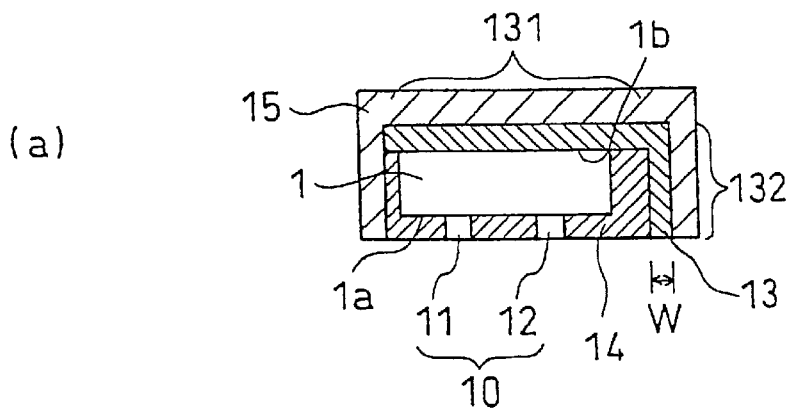
(a)
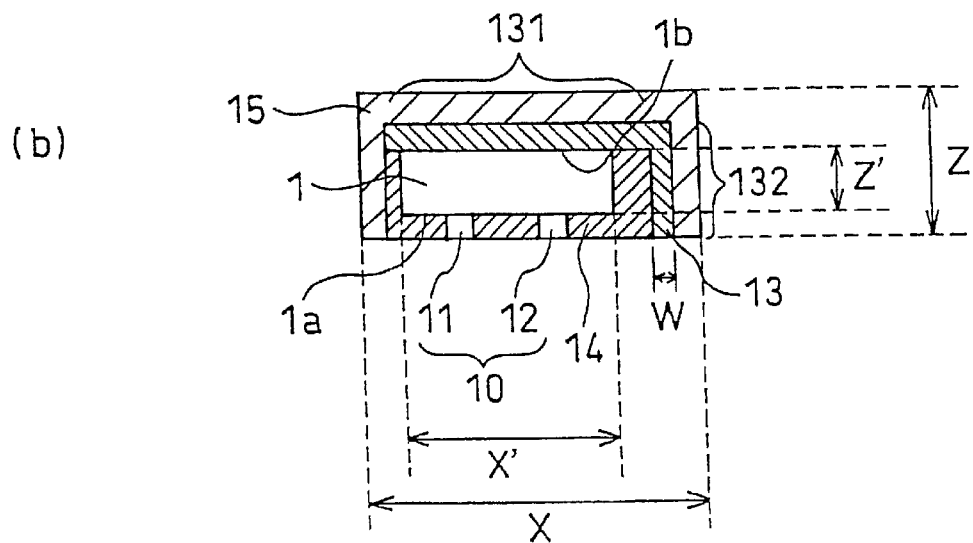
(b)
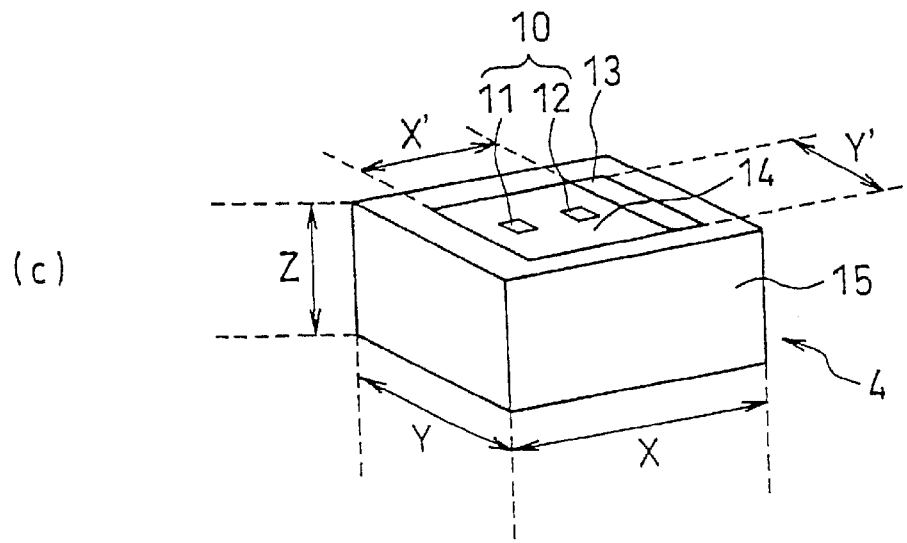
(c)

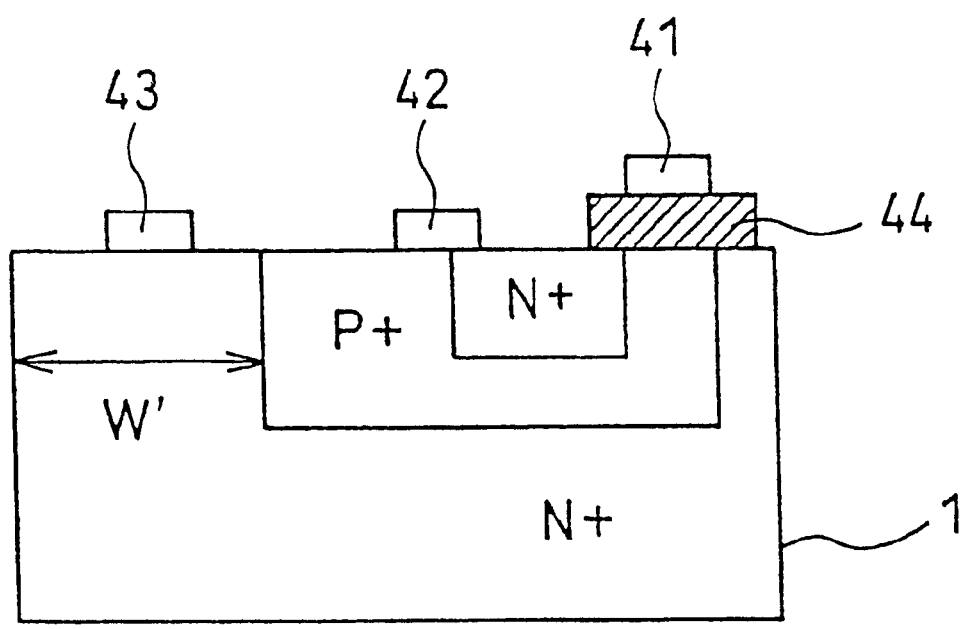

SEMICONDUCTOR DEVICE AND METHOD FOR MANUFACTURING SAME

This application is a division of application Ser. No. 09/506,005, filed on Feb. 17, 2000, now U.S. Pat. No. 6,323,061 the entire contents of which are hereby incorporated by reference.

BACKGROUND OF THE INVENTION

1. Field of the Invention

The present invention relates to a semiconductor device and to a method for manufacturing a semiconductor device, and more particularly it relates to a compact, thin semiconductor device, and to a method of manufacturing a semiconductor device with high productivity.

2. Background of the Invention

In recent years, in response to the demand for electronic equipment with sophisticated functions, compactness, light weight, and high speed, a variety of forms of semiconductor devices are being developed. For example, this is not even limited to integrated circuits, there being a demand for compactness and light weight in such discrete components as diodes and transistors as well.

For example, in a transistor of the past, there has been a configuration in which electrodes for outputting signals have been provided on a main surface and other electrodes have been provided on a surface that is opposite the main surface of the chip 1. In contrast to this approach, in response to recent demand for compactness in semiconductor devices, there have been attempts to achieve compactness by providing a plurality of electrodes on a single surface of the semiconductor chip.

FIG. 5 shows a cross-section view of a transistor of the past which has a plurality of electrodes on a single surface of the semiconductor chip. In this semiconductor device of the past, as shown in FIG. 5, on one surface of a semiconductor chip 1 are provided a gate electrode (or base electrode) 41, a source electrode (or emitter electrode) 42, and a drain electrode (or collector electrode) 43.

In a transistor such as shown in FIG. 5, however, the following problem occurs.

In general, a transistor has characteristics such that, by applying a voltage to the gate electrode, the value of resistance between the drain electrode and the source electrode is reduced (this resistance value being referred to hereinafter as the on resistance). In this case, in order to cause a prescribed current to flow in the drain electrode, a voltage is applied to the drain electrode, this being smaller the smaller the on resistance is. While the power consumption of each transistor is not that large, because a large number of such transistors are provided in the circuit product, it is desirable that the power consumption of each transistor be made smaller. That is, because the power consumed to drive a transistor is smaller the smaller the on resistance is, it is desirable to make the on resistance of the transistor small.

The resistance value r of an electrode is generally determined as p=l/S (where p is the resistivity, l is the length of the electrode, and S is the cross-sectional area). In a semiconductor device of the past such as shown in FIG. 5, if the width W' of the drain electrode 43 is made larger, the resistance value r, which is the on resistance, becomes smaller. However, the drain electrode 43 is formed of a semiconductor substance formed by a diffusion process as described above, the only way to make the cross-sectional area, or the width W' of the drain electrode 43 large, is to make the semiconductor chip 1 larger. That is, in a semiconductor device of the past such as shown in FIG. 5, it is not possible to make the semiconductor chip itself small and obtain a sufficiently large on resistance. Thus, in a conventional semiconductor device, in the case in which the drain electrode and the source electrode are formed on one and the same surface and in which a drain electrode is formed in proximity to the gate electrode and source electrode, there was the problem of not being able to achieve a small enough overall size.

Accordingly, it is an object of the present invention to solve the above-noted problem in the prior art, by providing a compact, thin semiconductor device. It is a further object of the present invention to provide a method for manufacturing a semiconductor device featuring good productivity.

SUMMARY OF THE INVENTION

In order to achieve the above-noted objects, the first aspect of the present invention is a semiconductor device comprising, a semiconductor chip having a first electrode on a main surface thereof, a second electrode made of a conductive resin electrode having a base portion in contact with a surface opposite to the main surface of the semiconductor chip, and a side portion extended from one end portion of the base portion in the direction toward the main surface of the semiconductor chip, and an end part of the side portion of the second electrode is provided over the main surface of the semiconductor chip.

In the present invention, the second electrode has a bending part formed between the base portion and the side portion at a substantially right angle.

In the present invention, the side portion of the second electrode is provided between a first insulating resin which seals at least the main surface of the semiconductor chip and a second insulating resin which seals surfaces other than the main surface of the semiconductor chip.

In the present invention, the side portion of the second electrode is provided along one side surface of the semiconductor chip.

The second aspect of the present invention is a method of manufacturing a semiconductor device comprising; a first step of forming a plurality of first electrodes 10 (11,12) on a main surface 0a of a semiconductor wafer 0, a second step of affixing the semiconductor wafer 0 to a first tape 29 so that the first electrodes 10 are facing up, a third step of dicing the semiconductor wafer 0 in one direction along A–A' in FIG. 2(c), so as to form a plurality of semiconductor units 111 having a plurality of semiconductor chips 1, a fourth step of expanding width of first grooves 30 that are formed when the dicing in the third step is performed, a fifth step of orienting the plurality of semiconductor units 111 so that surfaces 1a on which the first electrodes 10 are provided are facing up, and arranging the plurality of semiconductor units 111 on a flat sheet 31 so as to form second grooves 18, a sixth step of covering surfaces 1a of the semiconductor units 111 and burying the second groove 18 with an insulating resin 14 and hardening the insulating resin 14, a seventh step of affixing the semiconductor units 111 to a second tape 32 so that the first electrodes 10 are facing down, an eighth step of dicing the semiconductor formed in the sixth step in a direction parallel to the second groove 18, at substantially the center of said second groove 18, so as to form third grooves 33, a ninth step of covering the semiconductor formed in the eighth step and burying the third grooves 33 with a conductive resin 16, a tenth step of dicing the semiconductor formed in the ninth step along boundaries formed between the conductive resin 16 and the insulating resin 14 so as to form second electrodes 13, an eleventh step of dicing the semiconductor formed in the tenth step in a direction perpendicular to the boundaries, so as to form a plurality of semiconductor devices 19 having the first electrode 10 and the second electrode 13, and forming fourth grooves 34 between the semiconductor devices 19, a twelfth step of expanding the fourth grooves 34, a thirteenth step of covering the semiconductor devices 19 formed in the eleventh step with an insulating resin 15, and burying the fourth grooves 34 with the insulating resin 15, and hardening the insulating resin 15, and a fourteenth step of dicing to form separate semiconductor devices 4 having a prescribed number of the semiconductor chips 1.

BRIEF DESCRIPTION OF THE INVENTION

FIG. 1(a) and FIG. 1(b) are cross-section views of a semiconductor device according to the present invention, and FIG. 1(c) is a perspective view of a semiconductor device according to the present invention.

FIGS. 2(a) to (d) are drawings showing the manufacturing process steps for a semiconductor device according to the present invention.

FIGS. 3(a) to (f) are cross-section views showing the manufacturing processes for a semiconductor device according to the present invention, and FIG. 3(g) is a cross-section view of a semiconductor device according to the present invention.

FIG. 5 is a cross-section view showing a semiconductor device of a prior art.

DESCRIPTION OF THE PREFERRED EMBODIMENTS

Figure 2:
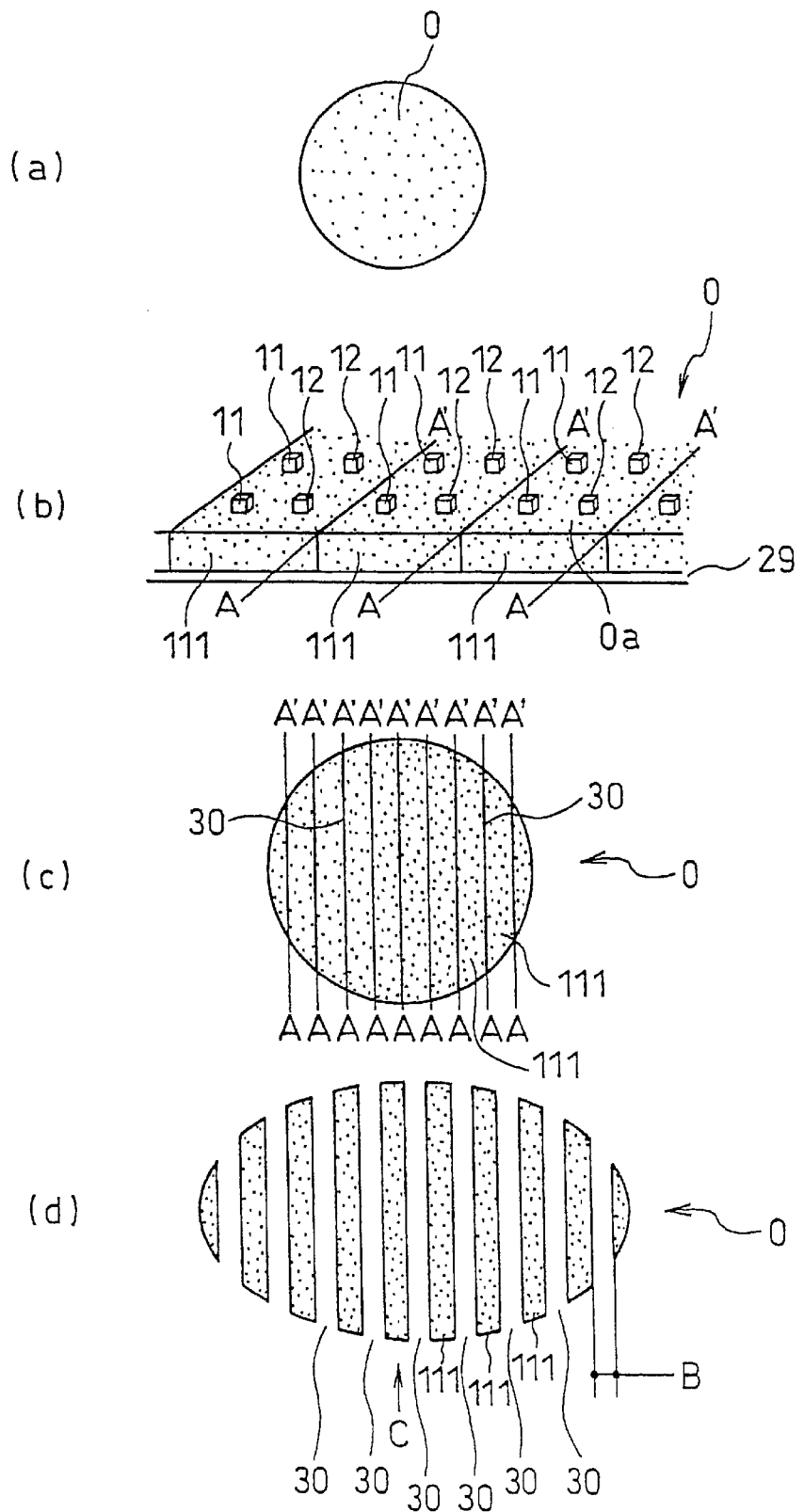

Embodiments of a semiconductor device and a method for manufacturing a semiconductor device according to the present invention are described in detail below, with reference made to relevant accompanying drawings. It will be understood, however, that the present invention is not restricted to the embodiments described herein, and can take on other various forms, within the spirit of the present invention.

A semiconductor device according to the present invention is a discrete semiconductor device such as a transistor, a diode, or a vertical-type MOSFET or the like, which, as shown in FIG. 1(a), has two types of electrodes 10(11,12) having differing characteristics on a main surface 1a of a semiconductor chip 1, and a drain electrode 13 (collector electrode) which is a conductive resin electrode formed by a base portion 131 and a side portion 132. That is, the semiconductor device has a drain electrode 13 formed by a base portion 131 in contact with a surface 1b on the opposite side from the main surface 1a, and a side portion 132 formed by extension from one end of the base portion 131 in the direction toward the main surface 1a, the surface 1b of the semiconductor chip 1 and the side surfaces of the side portion 132 of the drain electrode 13 being sealed by insulating resins 14 and 15, and the end parts of the two types of electrodes 10 and the end part of the side portion 132 being aligned on the same plane. That is, the extension direction of the end parts of the two types of electrodes 10 and the end part of the side portion 132 of the drain electrode 13 are made the same direction, and side surfaces other than the plane onto which the end parts of the two types of electrodes 10 and the end part of the drain electrode 13 made of a conductive resin are aligned and sealed with the insulating resins 14 and 15. The direction of extension of the ends of the two types of electrodes 10 and the end part of the drain electrode 13 can be said to be the extension direction for making connection to an external component outside the semiconductor device.

The semiconductor wafer 0 is already diffused, and onto the main surface thereof are formed two types of electrodes 10. In the present invention, the two types of electrodes 10 are a gate electrode (base electrode) 11 and a source electrode (emitter electrode) 12, these being provided as metal bumps of gold or the like, for the purpose of connection between the semiconductor chip 1 and an external component. The main surface as used herein is the surface of the semiconductor chip 1 on which the gate electrode 11 and the source electrode 12 are provided.

In the present invention, the drain electrode 13 is a conductive resin electrode made from a conductive resin, formed by curing a copper paste or silver paste, which is thermally curable. The base portion 131 of the drain electrode 13 is in contact with a surface 1b on the opposite side from the main surface 1a of the semiconductor chip 1, on which the electrodes 10 are formed. The side portion 132 of the drain electrode 13 makes contact with the insulating resin 14 and is a continuation of one end part of the base portion 131, extending in the direction of the main surface 1a, substantially perpendicular with respect to the base portion 131. The phrase "continuation of one end part of the base portion 131" herein refers to a bending of the base portion 131 at a substantially right angle from one end of the base portion 131. The phrase "continuation of one end part of the base portion 131, extending in the direction of the main surface 1a, substantially perpendicular with respect to the base portion 131" refers to formation of the base portion 131 and the side portion 132 so as to make an approximate L-shape therebetween, the side portion 132 extending in the direction of the main surface of the semiconductor chip 1, substantially being provided in parallel with one side surface of the semiconductor chip 1.

The insulating resins 14 and 15, as described above, seal the surface 1b of the semiconductor chip 1 and the drain electrode 13. In other words, the insulating resins 14 and 15 seals all surfaces of the semiconductor chip except 1 for end parts of the electrode 10 and the end part of the drain electrode 13 made of a conductive resin. For example, this is made of a highly conductive resin such as an epoxy resin or the like. The surface 1b of the semiconductor chip 1, as used herein, refers to the a surface other than a part in which the semiconductor chip 1 is in contact with the drain electrode 13, and the surface 13a of the drain electrode 13, as used herein, refers to a surface other than a part at which the drain electrode 13 is in contact with the semiconductor chip 1. As described above, although a side surface other than a part in which the semiconductor chip 1 is in contact with the drain electrode 13 is sealed by the insulating resins 14 and 15, the electrodes are formed so as to be exposed from the insulating resin 14 formed on the semiconductor chip 1, so as to make it possible to make a connection between the ends of the two types of electrodes 10, and the end part of the side portion 132 of the drain electrode 13 and an external component. That is, the end parts of the two types of electrodes 10, and the end part of the side portion 132 of the drain electrode 13 are not covered by the insulating resin 14. The end part of the side portion 132 of the drain electrode 13, as used herein, refers to the end part of the side portion 132 formed continuously from the base portion 131.

As described above, in a semiconductor device according to the present invention, the end parts of the two types of electrodes 10 and the end part of the side portion 132 of the drain electrode 13 are aligned on one and the same plane and, because it is possible on one and the same plane to make connection between the gate electrode 11 and the source electrode 12, which are the two types of electrodes 10, and the drain electrode 13 and an external component outside the semiconductor device, it is possible to achieve a small overall size and thinness. The drain electrode 13 is formed of a conductive resin, and because this resin has a resistivity that is smaller than a drain electrode of a semiconductor device of the past, even if the width W of the side portion 132 of the electrode 13 in FIG. 1 is made small, it is possible to achieve an electrode with a sufficiently small resistance value, thereby enabling the achievement of a compact semiconductor device with a reduced resistance between electrodes.

Next, a method of manufacturing a semiconductor device such as shown in FIG. 1 is described below, with reference being made to FIG. 2 and FIG. 3. First, the manufacturing process of a semiconductor chip 1 used in the present invention will be described, with reference made to FIG. 2.

First, a plurality of electrodes 10 (gate electrode 11 and source electrode 12), which are made of metal bumps, are formed on a diffused semiconductor wafer 0 (refer to the plan view of the semiconductor wafer 0 shown in FIG. 2(a)). An enlarged perspective view of the semiconductor wafer 0 of FIG. 2(a) is shown in FIG. 2(b). A gate electrode 11 and a source electrode 12 are provided at each prescribed location on the semiconductor wafer 0, these two types of electrodes 10, consisting of a gate electrode 11 and a source electrode 12, and a semiconductor chip 1 (obtained in a subsequent process step, refer to FIG. 3(g)) ultimately forming one device.

Next, dicing is done from the cross-section A–A' of the semiconductor wafer 0 shown in FIG. 2(b), so as to cut the semiconductor wafer 0 in parallel in one direction only, thereby forming a plurality of semiconductor chips 111 arranged in parallel, via a first groove 30 formed by the dicing. FIG. 2(c) shows a plan view of the semiconductor wafer 0 in this process step. Then, expansion of the semiconductor chip 111 is done in the direction of broadening the first groove 30, thereby broadening the mutual spacing B between the semiconductor chips 111 (refer to FIG. 2(d)).

Next, the manufacturing process of the present invention using the semiconductor chip 1 obtained from the process steps shown in FIG. 2, will be described, with reference being made to FIG. 3. FIG. 3 is a cross-section view in the direction of arrow C in FIG. 2(d). First, the semiconductor chips 111 obtained by the process shown in FIG. 2(d) are oriented so that the surface on which the two types of electrodes 10 are provided is facing up, and these are arranged on a flat sheet 31 so as to form the mutual spacing 18 between the semiconductor chips 111, after which an insulating resin 14 is applied to the semiconductor chip 1 and cured (refer to FIG. 3(a)). When this is done, the insulating resin 14 is filled so that the end parts of the two types of electrodes 10 are exposed.

Next, the semiconductor chip 1 is removed from the flat sheet 31, and the semiconductor chip 111 is affixed to a tape 32 so that the two type of electrodes 10 are facing down, and dicing is done from the upper surface (surface on the opposite side from the surface on which two types of electrodes 10 are provided) in parallel with the second groove 18 and at substantially the center between the semiconductor chips 111 sealed by the insulating resin 14, so as to form a third groove 33 between the insulating resin 14 (refer to FIG. 3(b)). Then, a conductive resin 16 is applied onto the second groove 33, the entire surface of the semiconductor chip 111, and the insulating resin 14 (refer to FIG. 3(c)).

Then, dicing is done from the cutting plane D (boundary between the conductive resin 16 and the insulating resin 14), and dicing is done between the semiconductor chips 111 in a direction perpendicular to the cutting plane D, thereby forming a plurality of semiconductor devices 19 having at least one semiconductor chip 1, two types of electrodes 10 and one drain electrode 13 made of the conductive resin 16, with fourth grooves 34 formed between the devices 19 (refer to FIG. 3(c) to FIG. 3(e)). Then, the overall device shown in FIG. 3(e) is expanded so as to expand the fourth groove 34, after which insulating resin 15 is filled into the third groove 34 and onto the drain electrode 13 and allowed to cure (refer to FIG. 3(f)). Finally, cutting is done (at the cutting plane E–E') so as to include a prescribed number of devices, thereby resulting in a semiconductor device according to the present invention (refer to FIG. 3(g)). As shown above, in a method for manufacturing a semiconductor device according to the present invention, because it is possible to fabricate a large number of semiconductor devices using a plurality of semiconductor chips 1 obtained from the semiconductor wafer 0, it is possible to improve productivity. From the above, it is possible to reduce the cost of manufacturing a semiconductor device.

Figure 3:
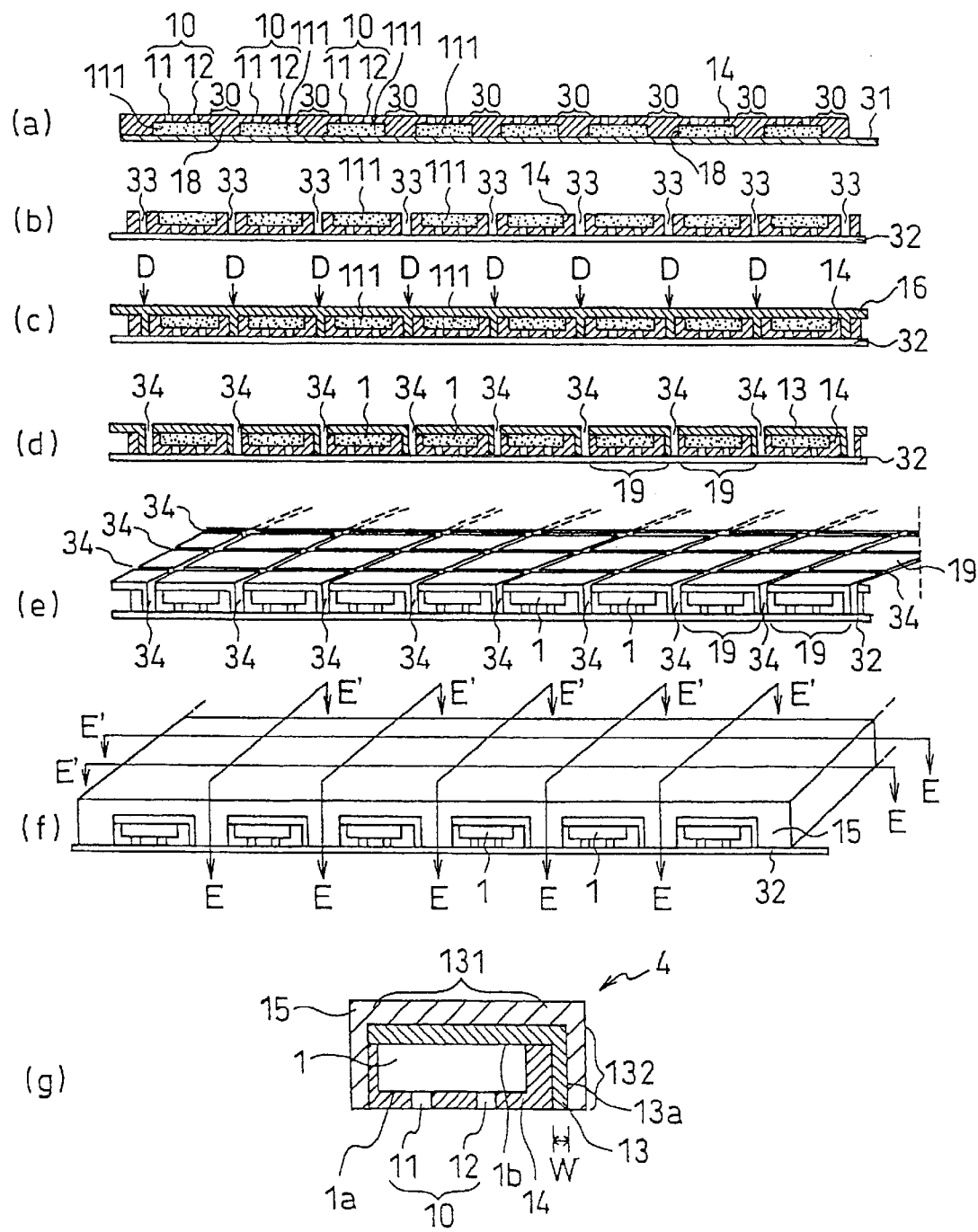

The semiconductor device manufactured by the process steps illustrated in FIG. 2 and FIG. 3 is shown in FIG. 1(b) and FIG. 1(c). FIG. 1(b) is a cross-section view showing the same type of semiconductor device as FIG. 2(g), and FIG. 1(c) is a perspective view of the semiconductor device. The semiconductor device of the present invention obtained by the above-noted manufacturing processes has a long side X, a short side Y, and a height Z that are one to three times the long side X', the short side Y', and the height Z' of the semiconductor chip. Because of this, it is possible to obtain a semiconductor device that is more compact than a conventional semiconductor device.

Figure 4:
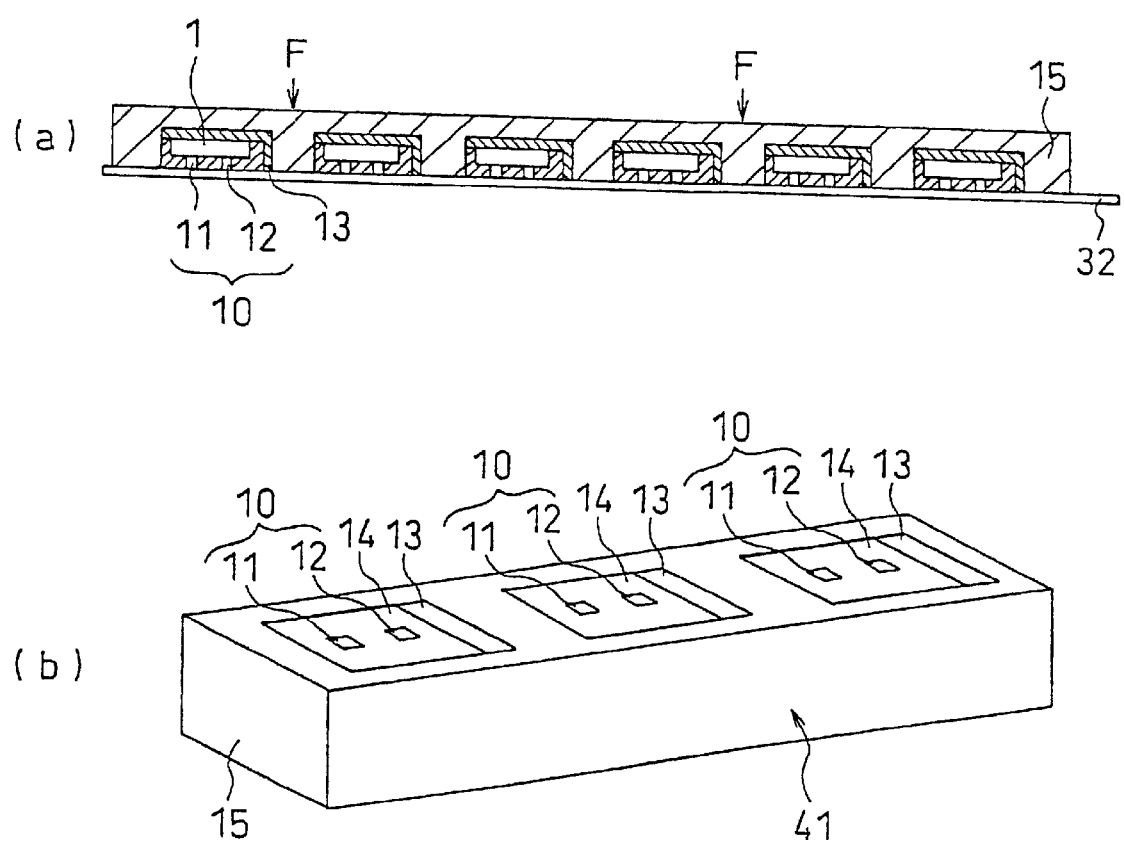
FIG. 4(a) is a drawing showing another embodiment of the present invention.
FIG. 4(b) is a perspective view of the present invention in FIG. 4(a).

In the processes shown in FIG. 2 and FIG. 3, by cutting the device 19 that includes one semiconductor chip 1, each device includes one gate electrode 11, one source electrode 12, and one drain electrode 13. As shown in FIG. 4(a), by cutting the semiconductor device along the cutting plane F, it is possible to obtain a semiconductor device 41 that includes a plurality of devices 4. While FIG. 4(b) shows the example of a unit in which the semiconductor chips 1 are arranged in a line, there is no restriction to arrangement of the semiconductor chips 1, and by changing the position of the cutting plane F, it is possible to achieve an arrangement configuration suitable to the application. Thus, by changing the number of semiconductor chips 1 including in one unit and the arrangement configuration thereof to suit requirements, it is possible to fabricate a semiconductor device having a desired number of semiconductor chips and desired unit configuration, thereby enabling the achievement of a semiconductor device having a configuration that is optimized for an application.

According to the present invention as noted above, it is possible to make a connection between the two types of electrodes and the conductive resin electrode and external components outside the device on one surface, thereby enabling the achievement of a small overall semiconductor device size. The conductive resin electrode is made of a conductive resin, which has a resistivity that is lower than that of the drain electrode of a conventional semiconductor device, so that even if the width of the side portion of the electrode is small, it is possible to achieve an electrode with a sufficiently small resistance value, thereby enabling the achievement of a compact semiconductor device with a reduced resistance between electrodes.

What is claimed is:

1. A semiconductor device comprising;
   a semiconductor chip having a first electrode on a main surface thereof,
   a second electrode made of a conductive resin electrode having a base portion in contact with a surface opposite to said main surface of said semiconductor chip, and a side portion extended from one end portion of said base portion in the direction toward said main surface of said semiconductor chip, and
   an end part of said side portion of said second electrode is provided over said main surface of said semiconductor chip.

2. A semiconductor device according to claim 1, wherein said second electrode having a bending part formed between said base portion and said side portion at a substantially right angle.

3. A semiconductor device according to claim 1, wherein said side portion of said second electrode is provided between a first insulating resin which seals at least said main surface of said semiconductor chip and a second insulating resin which seals surfaces other than said main surface of said semiconductor chip.

4. A semiconductor device according to claim 1, wherein said side portion of said second electrode is provided along one side surface of said semiconductor chip.

* * * * *